(12) United States Patent
Doshi et al.

(10) Patent No.: US 6,808,867 B2
(45) Date of Patent: Oct. 26, 2004

(54) PHOTO-DEFINABLE SELF-ASSEMBLED MATERIALS

(75) Inventors: Dhaval Doshi, Albuquerque, NM (US); Hongyou Fan, Albuquerque, NM (US); Nicola Huesing, Vienna (AT); Alan Hurd, Tijeras, NM (US); Charles Jeffrey Brinker, Albuquerque, NM (US)

(73) Assignee: Science & Technology Corporation @ University of New Mexico, Albuquerque, NM (US)

( * ) Notice: Subject to any disclaimer, the term of this patent is extended or adjusted under 35 U.S.C. 154(b) by 178 days.

(21) Appl. No.: 10/100,108

(22) Filed: Mar. 19, 2002

(65) Prior Publication Data

US 2002/0127498 A1 Sep. 12, 2002

Related U.S. Application Data

(62) Division of application No. 09/543,572, filed on Apr. 5, 2000, now abandoned.
(60) Provisional application No. 60/127,803, filed on Apr. 5, 1999.

(51) Int. Cl.[7] .............................................. G03F 7/00
(52) U.S. Cl. ..................... 430/320; 430/322; 430/330; 430/396
(58) Field of Search ............................... 430/320, 322, 430/330, 396

(56) References Cited

U.S. PATENT DOCUMENTS

| | | | |
|---|---|---|---|
| 5,057,296 A | 10/1991 | Beck | 423/277 |
| 5,098,684 A | 3/1992 | Kresge et al. | 423/277 |
| 5,360,834 A | 11/1994 | Popall et al. | 522/36 |

*Primary Examiner*—Mark F. Huff
*Assistant Examiner*—Nicole Barreca
(74) *Attorney, Agent, or Firm*—Schwegman, Lundberg, Woessner & Kluth, P.A.

(57) ABSTRACT

The present invention provides a mesoporous material comprising at least one region of mesoporous material patterned at a lithographic scale. The present invention also provides a a method for forming a patterned mesoporous material comprising: coating a sol on a substrate to form a film, the sol comprising: a templating molecule, a photoactivator generator, a material capable of being sol-gel processed, water, and a solvent; and exposing the film to light to form a patterned mesoporous material.

26 Claims, 18 Drawing Sheets

XRD and TEM results show a phase transformation from a disordered to a 1dH mesophase with UV irradiation for a calcined 4% CTAB film HRTEM of NOT Irradiated

OPTICAL PROPERTIES

| | | |
|---|---|---|
| Unirradiated | 3651± 26 | 1.454 |
| UV Irradiated | 3602± 21 | 1.457 |
| Unirradiated, Calcined | 2293± 22 | 1.302 |
| UV Irradiated Calcined | 2399± 23 | 1.277 |

Refractive index and thickness data obtained by spectroscopic ellipsometry, η at λ=630nm

* Refractive index difference can be utilized
* for wave guide applications
* A gradient of refractive index would be
* useful for non-linear optics Photoacids are compounds that generate acids upon irradiation with light. Diaryliodonium compounds release a strong Bronsted acid.

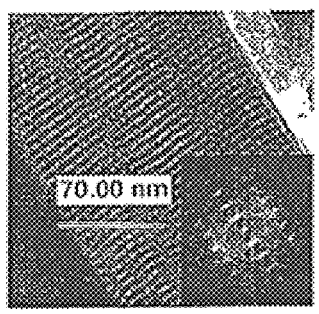
Fig. 5B
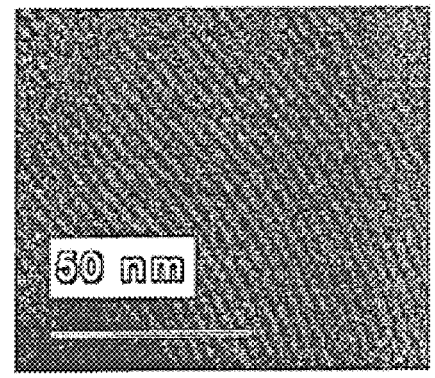
Fig. 6B
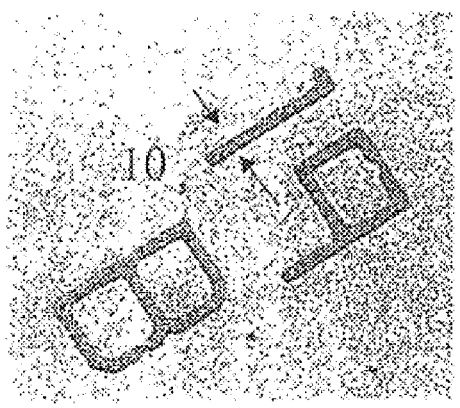
Fig. 6A
Fig. 6C

PHOTO-DEFINABLE SELF-ASSEMBLED MATERIALS

CROSS-REFERENCE TO RELATED APPLICATIONS

This application is a divisional application of U.S. patent application Ser. No. 09/543,572, entitled "Photo-Definable Self-Assembled Materials" filed Apr. 5, 2000, now abandoned, which claims priority to U.S. Provisional Patent Application No. 60/127,803, entitled "Nanostructural Lithography Tailoring of Mesophases in Thin Silica Films" filed Apr. 5, 1999. The entire disclosures and contents of above-identified patent applications are hereby incorporated by reference.

GOVERNMENT INTEREST STATEMENT

This invention is made with government support under Grant Number BF-4277 awarded by Sandia National Laboratories. The government may have certain rights in this invention.

BACKGROUND OF THE INVENTION

1. Field of the Invention

The present invention relates to mesoporous structures.

2. Description of the Prior Art

The International Union of Pure and Applied Chemistry, IUPAC, classifies porosity on the basis of pore diameter, $d_p$. Mesoporous materials are defined by IUPAC as those materials in which 2 nm mesoporous inorganic materials comprise inorganic xerogels (e.g., the common silica desiccants), pillared clays, and the subject matter of this patent viz. mesoporous molecular sieves (MMS), discovered by researchers at Mobil and are described U.S. Pat. No. 5,098,684, issued to Kresge et al. On Mar. 24, 1992 and U.S. Pat. No. 5,057,296 issued to J. S. Beck on Oct. 15, 1991, the entire contents and disclosures of which are hereby incorporated by reference. These materials are referred to in the literature as the MCM (Mobil composition of matter) family of materials. MMS prepared generally as powders have received enormous attention by the research community since their announcement by Kresge et al. (Kresge C. T., Leonowicz M. E., Roth W. J., Vartuli J. C., Beck J. S., Nature, 1992, 359: 710–712). In the past two years, advances have been made in understanding and exploiting the supramolecular templating process used in MMS formation, development of new synthetic procedures, extending the compositional range beyond silicas, and processing of MMS as thin films. MMS are high surface area amorphous solids (surface area up to 1400 m.sup.2/g) characterized by monosized cylindrical pores, ranging from about 12–100 .ANG. in diameter, organized into periodic arrays that often mimic the liquid crystalline phases exhibited by surfactants. MMS synthesis procedures typically require four reagents: water, surfactant, a soluble inorganic precursor, and catalyst. MMS form (as precipitates) in seconds to days (Beck J. S., Vartuli J. C., Roth W. J., Leonowicz M. E. Kresge C. T., Schmitt K. D., Chu C. T. W., Olson D. H., Sheppard E. W., McCullen S. B. et al., J. Am. Chem. Soc., 1992, 114: 10835; Huo Q., Margolese D. L., Ciesla U., Demuth D. G., Feng P., Gier T. E., Sieger P., Firouzi A., Chmelka B. F., Schuth F., Stucky G. D., Chem. Mater., 1994, 6: 1176–1191) at temperatures ranging from 180. degree. C. to as low as –14. degree. C., depending on the inorganic precursor. Before pyrolysis or surfactant extraction, pure silica MMS exhibit three structure types: (1) hexagonal (referred to as H or MCM-41), a 1-d system of hexagonally ordered cylindrical silica channels encasing cylindrical surfactant micellar assemblies; (2) cubic (C), a 3-d, bicontinuous system of silica and surfactant; and (3) lamellar, a 2-d system of silica sheets interleaved by surfactant bilayers.

Over the past several years various MMS synthetic pathways have been elucidated (Beck J. S., Vartuli J. C., Curr. Opinion in Solid State and Material Science, 1996, 1: 76–87). Experimentally, it has been shown that MCM-41 type phases form under conditions in which the surfactant—before the addition of the silica source—is: a) free (surfactant concentration, c, is less than the critical micelle concentration for spherical micelles, c. In the past several years, there has been synthesized multicomponent and non-silica MMS (Huo Q., Margolese D. L., Ciesla U., Demuth D. G., Feng P., Gier T. E., Sieger P., Firouzi A., Chmelka B. F., Schuth F., Stucky G. D., Chem. Mater., 1994, 6: 1176–1191) for catalytic applications due to their higher surface areas and greater accessibility of active sites compared to zeolites.

In the past few years various pathways have been explored to access a wide spectrum of mesostructured materials with tunable pore sizes and arrangements (orientation) and good compositional control. These materials include ionic, covalent and electrostatic interactions, and they permit the addition of salts and auxiliary solvents. A variety of macro- and microstructures have been synthesized such as powders, fibers, monoliths, thin films, hollow and transparent hard spheres, and aerosol particles, which find applications in catalysis, membrane separation, sensors, optoelectronics and as novel nanomaterials, see Jackie Y. Ying, C. P. Mehnert, M. S. Wong Angew. Chem. Int. Ed. 1999, 38, 56–77.; C. J. Brinker Curr. Opin. Solid State Mater. Sci., 1, 798–805, 1996; J. C. Vartuli, C. T. Kresge, W. J. Roth, S. B. McCullen, J. S. Beck, K. D. Schmitt, M. E. Leonowitz, J. D. Lutner, E. W. Sheppard in Advanced Catalysts and Nanostructured Materials: Modem Synthesis Methods (Ed: W. R. Moser) Academic Press, N.Y., 1–19 (1996); G. D. Stucky, Q. Huo, A. Firouzi, B. F. Chmelka, S. Schacht, I. G. Voigt Martin, F., Schüth in Progress in Zeolite and Microporous Materials, Studies in Surface Science and Catalysis, 105, (Eds: H. Chon, S. K. Ihm, Y. S. Uh), Elsevier, Amsterdam, 3–28, (1997); N. K. Raman, M. T. Anderson, C. J. Brinker Chem. Mater., 8, 1682–1701. 1996; D. M. Antonelli, J. Y. Ying, Curr. Opin. Coll. Interf. Sci., 1, 523–529, 1996.; D. Zhao, P. Yang, Q. Huo, B. F. Chmelka and G. D. Stucky, Current Opinion in Solid State & Materials Science, 3,111–121, 1998; Y. Lu, H. Fan, A. Stump, T. L. Ward, T. Rieker, C. J. Brinker, Nature, 398, 223–226, 1999. However, none of these process has provided the ability to design these materials with a controlled combination of mesophases or the ability to pattern functionality.

SUMMARY OF THE INVENTION

It is therefore an object of the present invention to provide a lithographic process which allows control of structure and properties (refractive index, thickness, porosity, pore orientation) and functionality of meso-ordered films, powders and bulk systems.

It is another object of the present invention to provide a lithographic process that uses the presence of a photoactive/photosensitive species to affect the mesophase of meso-ordered films, powders and bulk systems.

It is yet another object of the present invention to provide a lithographic process that uses a photoactive/photoresponsive amphiphile to affect the mesophase of meso-ordered films, powders and bulk systems.

It is yet another object of the present invention to provide a lithographic process that uses photoacid/base generation to affect the mesophase of meso-ordered films, powders and bulk systems.

It is yet another object of the present invention to provide a lithographic process that uses photoacid/base generation to affect the sol-gel network of meso-ordered films, powders and bulk systems.

It is yet another object of the present invention to provide a lithographic process that incorporates a photoacid/base generator in mesopores to obtain better resolution of pattern transfer and hence etching of sol-gel network in meso-ordered films, powders and bulk systems.

It is yet another object of the present invention to provide a lithographic process that induces temporary hydrophobicity in controlled regions via the use of a photoactive species.in meso-ordered films, powders and bulk systems.

It is yet another object of the present invention to provide a lithographic process that uses photolysis to carry out polymerization along with mesophase changes to get hybrid materials in meso-ordered films, powders and bulk systems.

It is yet another object of the present invention to provide a lithographic process that allows acid-base sensitive chemistry to be performed in mesostructured thin films.

It is yet another object of the present invention to provide a lithographic process that allows functionalized materials to be obtained.

It is yet another object of the present invention to provide a lithographic process that is suitable for compounds of Si, Al, B, Pb, Sn, Ti, Zn, Zr, Ce, La, Y and Nd which are capable of sol-gel processing.

According to a first broad aspect of the present invention, there is provided a mesoporous material comprising at least one region of mesoporous material patterned at a lithographic scale.

According to a second broad aspect of the invention, there is provided a method for forming a patterned mesoporous material comprising: coating a sol on a substrate to form a film, the sol comprising: a templating molecule, a photoactivator generator, a material capable of being sol-gel processed, water, and a solvent; and exposing the film to light to form a patterned mesoporous material.

Other objects and features of the present invention will be apparent from the following detailed description of the preferred embodiment.

BRIEF DESCRIPTION OF THE DRAWINGS

The invention will be described in conjunction with the accompanying drawings, in which:

FIG. 5B is a cross-section HR-TEM image of the 3% Brij 56 film made with 1N acid;

FIG. 6A is an optical image of an etched/calcined film of the present invention;

FIG. 6B is a listing of $^{29}$Si-NMR results of uncalcined powders made from drying Brij-56/PAG sols in a petri dish for the UV irradiated and unirradiated films;

FIG. 6C is an HR-TEM image of an etched/calcined Brij-56 film of the present invention;

DETAILED DESCRIPTION OF THE PREFERRED EMBODIMENT

Figure 1:
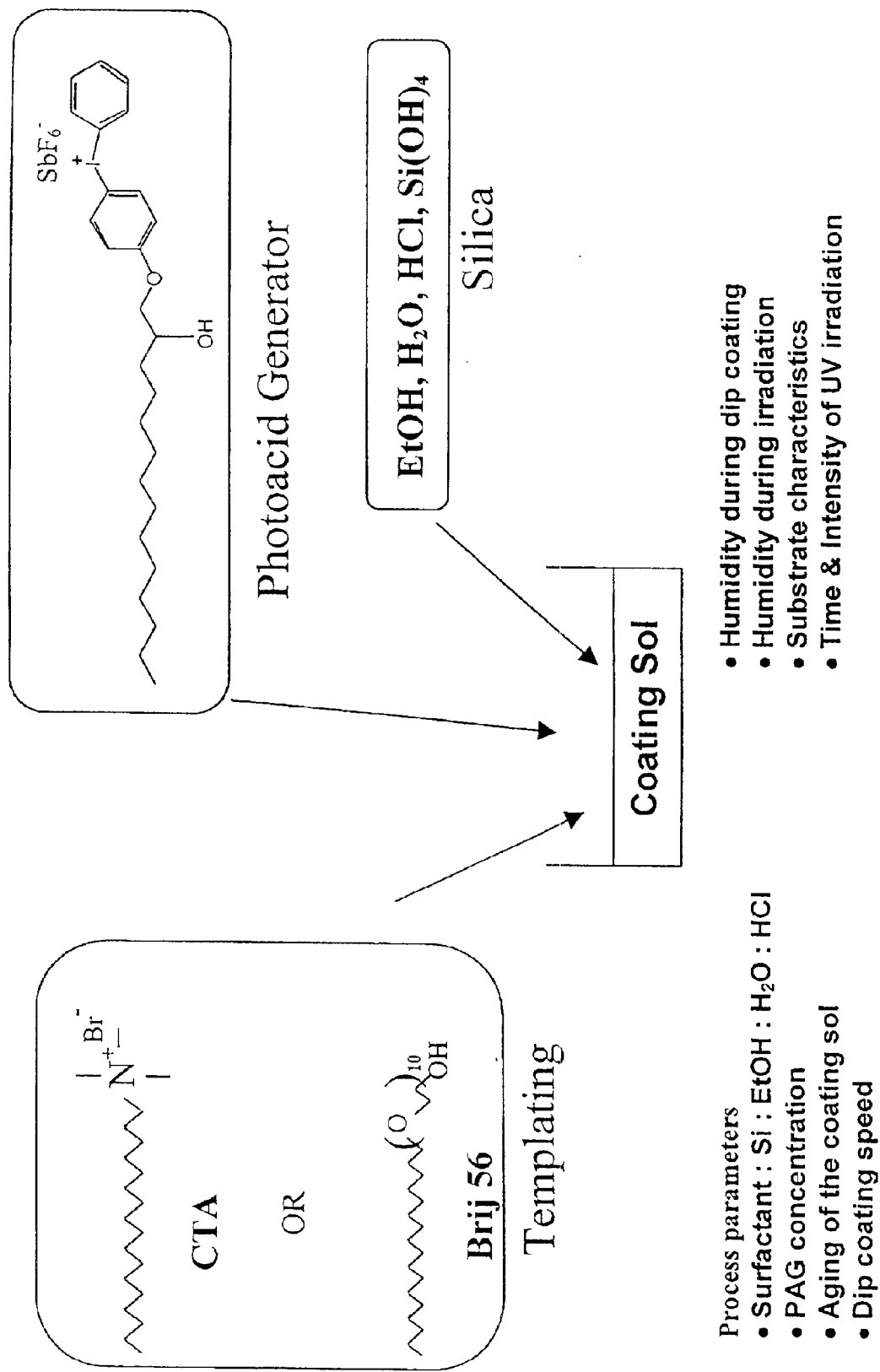
FIG. 1 illustrates, in schematic form, the chemistry and process parameters for forming a coating sol used in the method of the present invention.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, the term "lithographic technique" refers to any process, including conventional lithographic processes such as using masks with UV light exposure or other forms of light or electromagnetic exposure, followed optionally by etching by an acid, base, etc. or optionally by heating/calcination that may be used for to form a pattern in silica.

For the purposes of the present invention, the term "pattern" refers to any silica structure having a shape or property that may be defined using lithographic techniques, whether or not the pattern is actually formed using a lithographic technique or another type of technique.

For the purposes of the present invention, the term "patterned at a lithographic scale" refers to a pattern having the size of any pattern that may be formed in silica using a lithographic technique. A pattern of the present invention has a lithographic scale whether the pattern is formed using a lithographic technique or another type of technique.

For the purposes of the present invention, the term "unpatterned" refers to any material that is not patterned at a lithographic scale.

For the purposes of the present invention, the term "capable of being sol-gel processed" includes any compound that may be used in sol-gel processing techniques such as those described in, U.S. Pat. No. 5,360,834, the entire disclosure and contents of which is hereby incorporated by reference. Hydrolytic polycondensation by the sol-gel process is a process which is well-known in the prior art for production of amorphous inorganic networks which can be converted into glasses, ceramics and inorganic-organic hybrid materials, see, for example, H. Schmidt, J. Non-Crystall. Solids, 100 (1988), page 51, C. J. Brinker, loc. cit. page 31 and J. Fricke. loc. cit. page 169). Monomeric or precondensed hydrolyzable and condensable compounds having an inorganic central atom are hydrolyzed and pre-condensed by adding water and if appropriate catalyst, until a sol forms; condensation to a gel is then carried out, in bulk or during film coating, usually by adding a pH-active catalyst. The gel can be converted into the above-mentioned materials by treatment with heat and/or radiation. Compounds capable of being using in sol-gel processing include not only the Si compound silica, but compounds of Al, B, Pb, Sn, Ti, Zn, Zr, Ce, La, Y, Nd, etc.

For the purposes of the present invention, the term "photoactivator" refers to any compound that is a photoacid or a photobase. A photoactivator generator is any compound that forms or decomposes to a photoactivator, either a photoacid or a photobase, in the presence of light, such as UV light.

For the purpose of the present invention, the term "solvent" refers to any aprotic or protic solvent such as methanol, ethanol, tetrahydrofuran, etc.

For the purposes of the present invention, the term "hybrid material" refers to any material that is composed of an organic polymer and an inorganic polymer.

Description

Control of structure on multiple length scales is evident in Nature and crucial to advances in micro- and nanotechnologies. To date thin film silica mesophases have been prepared by nucleation and growth at solid-liquid and liquid-vapor interfaces, spin-coating, and dip-coating, and these procedures have been combined with soft lithographic techniques ($\mu$CP and MMIC) pioneered by Whitesides to create patterned films. However patterns so formed require long processing times and have been limited to the spatially-defined presence or absence of film. For sensor arrays and micro-fluidic devices, it would be also of interest to pattern the thin film mesostructure (for example, hexagonal versus cubic or disordered), thereby spatially controlling properties like refractive index, pore volume, pore size, dielectric constant and accessibility of the thin film mesoporosity to the vapor or liquid phase. We have developed a lithographic procedure that enables selective etching of silica mesophases (thereby serving as a 1-step negative resist process) and allows patterning index, and wetting behavior.

The patterning process of the present invention exploits the pH-sensitivity of both the (silica-) surfactant self-assembly process and the siloxane condensation rate to enable lithographic definition of film presence or absence as well as spatial control of thin film mesostructure. We begin with a homogeneous solution of soluble silica, surfactant, photoacid generator (PAG, a diaryliodonium salt) and HCl with initial acid concentration designed to minimize the siloxane condensation rate. Preferential ethanol evaporation during dip-coating concentrates the depositing solution in water, silica, surfactant, HCl, and PAG, thereby promoting self-assembly into a photosensitive, silica/surfactant, thin film mesophase. Selective exposure of the photosensitive film to ultraviolet light, using a photo-mask, creates patterned regions of differing acidity. This pH difference affords spatial control of refractive index, thickness, wetting behavior and the mesostructure in the mesoscopic thin films.

The increasing acid-concentration promotes siloxane condensation, so selective UV exposure results in patterned regions of more highly and more weakly condensed silica. Differential siloxane condensation results in turn in differential solubility, allowing selective etching of weakly condensed regions in aqueous basic media, such as 0.2 M NaOH.

Cooperative self-assembly processes of inorganic species and amphiphilic molecules have experienced major advances over the past six years. The ability to design these materials with spatially controlled combinations of different mesophases or compositions, and therefore different properties, would greatly enhance their utility as nanofunctional surfaces, films, and coatings.

The present invention provides a simple lithographic procedure, which allows a deliberate control of structure and properties of a meso-ordered silica film through optical mediation. This nanostructural lithography process exploits the pH sensitivity of supra-molecular self-assembly which allows spatial control over mesophases in the thin film and a selective etching capability. Through the addition of a photoacid generator in the coating sol along with surfactant and silica source, dip coating results in continuous, ordered photosensitive films. Exposure to UV light through a mask produces local pH changes, which may induce mesostructural phase transitions and an increase in the acid-catalyzed siloxane condensation rate in the exposed regions. Two surfactant systems, CTAB ($CH_3(CH_2)_{15}N^+(CH_3)_3Br^-$) and Brij 56 ($CH_3(CH_2)_{15}(OCH_2CH_2)_{10}OH$) have been studied. X-ray diffraction, transmission and scanning electron microscopy, optical microscopy, ellipsometry, MAS-NMR and atomic force microscopy are used to characterize the patterned nanostructured materials as thin films or as powders.

Various strategies to pattern mesoporous films have been explored, most of these relying on the use of self-assembled monolayers(SAM), see A. Kumar, N. L. Abott, E. Kim, H. A. Biebuyck, G. M. Whitesides, Acc. Chem. Res., 28, 219–226, 1995. Popall et. Al, see M. Popall, J. Schulz and H. Schmidt, U.S. Pat. No. 5,360,834 (Nov. 1, 1994), have shown that the formation of the inorganic network by sol-gel processing could be influenced photochemically. Furthermore, the sensitivity of the surfactant lyotropic phases to temperature and pH is well known, see M. J. Rosen, *Surfactants and Interfacial Phenomena*, Wiley-Interscience, N.Y., (1989). The present invention provides a process that exploits the pH sensitivity of supra-molecular self-assembly by adding a photoacid generator (PAG) in the coating sol to carry out optically induced nanostructural lithography. Two surfactant systems which represent different types of interactions have been investigated: for ionic interactions, CTAB was chosen, whereas electrostatic and hydrogen-bonding interactions were explored using a non-ionic block co-polymer Brij 56.

The method of forming a coating sol of the present invention, as shown in FIG. 1 starts with a homogenous solution composed of soluble silicate species, a photoacid generator, and surfactant in an ethanol/water solvent with an initial surfactant concentration $c_0$ below the critical micelle concentration $c_{cmc}$. The method of the present invention employs solvent evaporation-based self-assembly of the surfactant as described previously, see Y. Lu, R. Ganguli, C. A. Drewien, M. T. Anderson, C. J. Brinker, W. Gong, Y. Guo, H. Soyez, B. Dunn, M. H. Huang, J. I. Zink, Nature, 389, 364–368, 1997. The $c_0$ was adjusted in a way that liquid crystal-like structures in the silica/surfactant/solvent/$H^+$ phase diagram close to a phase boundary are accessible. The choice of the photoacid generator (PAG), a diaryliodonium compound, was based on its wide application in cationic polymerization, its efficiency in generation of acid upon photolysis, and a well understood photochemistry, see J. V. Crivello, J. H. W. Lam, J. Polym. Sci., Polym. Symp. 1976, 56, 383.; J. V. Crivello, J. H. W. Lam, Macromolecules 1977, 10, 1307.; J. L. Dektar, N. P. Hacker, J. Org. Chem. 1990, 55, 639. Due to a chemical modification with a long hydrocarbon chain, the PAG is partly solubilized in the surfactant micelle during solvent evaporation and therefore acts as a co-surfactant. This affects the effective packing parameter of the surfactant and hence the structure of the mesophase, see J. Israelachvili, *Intermolecular and surface forces*, Academic Press, San Diego, (1992). Photochemically induced acid generation in the film causes conditions conducive to structural changes in the pH sensitive silica-surfactant mesophase and also an enhancement in the siloxane condensation rate.

Although the process illustrated in FIG. 1 employs a specific material capable of being sol-gel processed, Si viz. silicic acid and polysilicic acids, other such materials may also be used in the method of the present invention. Although the process illustrated in FIG. 1 employs either of two templating molecules CTAB or Brij 56, other suitable templating molecules may be used in the method of the present invention. Although HCl is employed as a pH-adjusting acid in the process illustrated in FIG. 1, other suitable acids may be employed in the method of the present invention. Although a specific photoacid generator is employed as the photoacid generator in the process illustrated in FIG. 1, other suitable photoacids may be employed in the method of the present invention. Also, although only the use of a photoacid generator and photoacid is shown in FIG. 1, the method of the present invention also encompasses the use of a photobase generator and a photobase in place of a photoacid generator and a photoacid.

As indicated by FIG. 1, the method of the present invention may use various concentrations of a photoacid generator, may age the coating sol for various lengths of time, may use various coating speeds, may employ various levels of humidity during coating of the film on a substrate, may using various levels of humidity during the irradiation step, may be employed on various substrates, and may employ various times and intensities of irradiation and may employ various times and temperatures for heat treatment and various heat treatment techniques. Also various coating methods can be employed such as dip-coating, spin coating, spray coating, aerosol coating, etc.

Figure 2A:
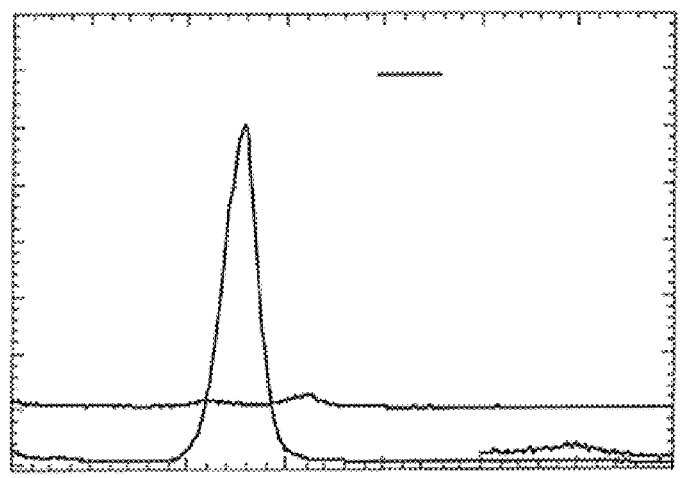
FIG. 2A illustrates an X-Ray diffraction pattern for a UV irradiated and unirradiated film after calcination for a 4% CTAB mesoporous film of the present invention.
Figure 2B:
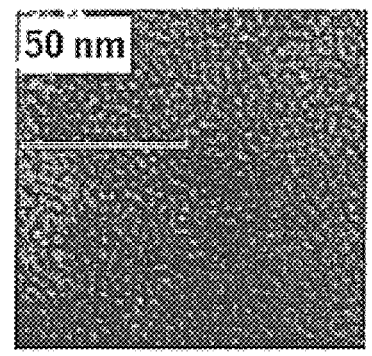
FIG. 2B is an HR-TEM of a mesoporous film that has not been irradiated corresponding to the pattern in 2A.

As shown in FIG. 2A, UV irradiation causes a calcined 4% CTAB mesoporous film of the present invention to undergo a phase change. FIG. 2B shows the same film, except that the film in FIG. 2B has not been UV irradiated, and, therefore, is unpatterned.

Figures 3A, 3B:
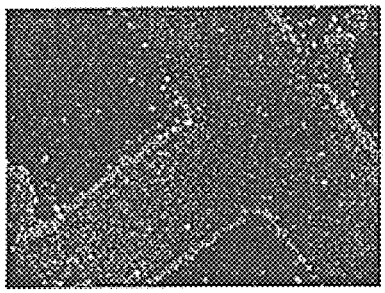
FIG. 3A is a listing of optical properties for various mesoporous films.
FIG. 3B is an optical image of a patterned mesoporous film of the present invention.

As can be seen in the listing of optical properties in FIG. 3A, there is a significant different in optical properties between the UV irradiated and unirradiated portions of a given mesoporous film of the present invention. FIG. 3B shows an optical image of a pattern that may be formed by UV irradiating a film of the present invention.

Figure 4B:
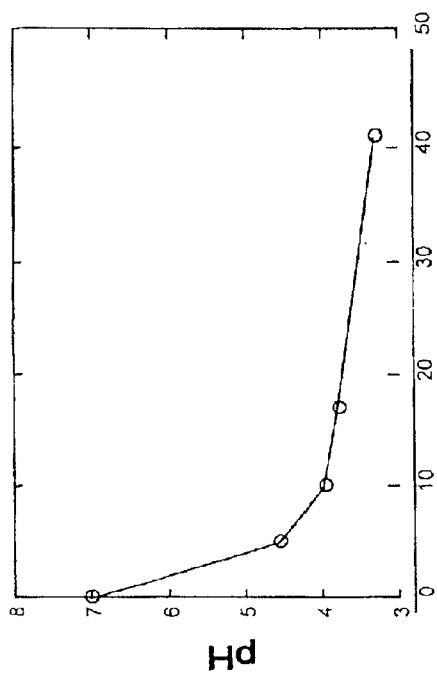
FIG. 4B illustrates the change in pH for the photoacid of FIG. 4A due to the exposure of the photoacid to UV light.
Figure 4C:
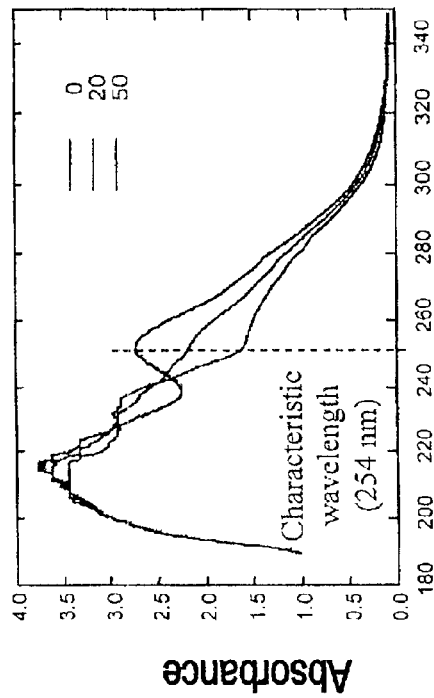
FIG. 4C illustrates the change in absorbance, taken at a characteristic wavelength of 254 nm, for the photoacid of FIG. 4A due to the exposure of the photoacid to UV light.
Figure 4A:
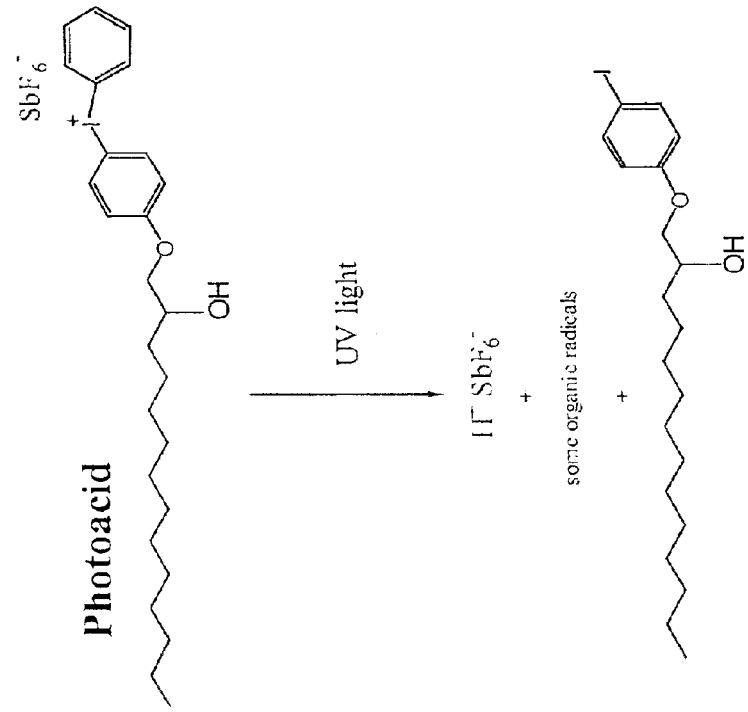
FIG. 4A illustrates the reaction of UV light with a photoacid useful in making the mesoporous film of the present invention.

FIG. 4A illustrates the reaction of UV light with the diaryliodonium photoacid used in the process illustrated in FIG. 1. As can be seen in FIG. 4B, exposure of the photoacid to light decomposes and activates the photoacid, as shown in FIG. 4A, and thereby reduces the pH of a solution or environment containing the acid. FIG. 4C illustrates how the absorbance at a characteristic wavelength of the photoacid is reduced as the photoacid is exposed to UV light and the photoacid decomposes and is activated as illustrated in FIG. 4A.

Figure 5A:
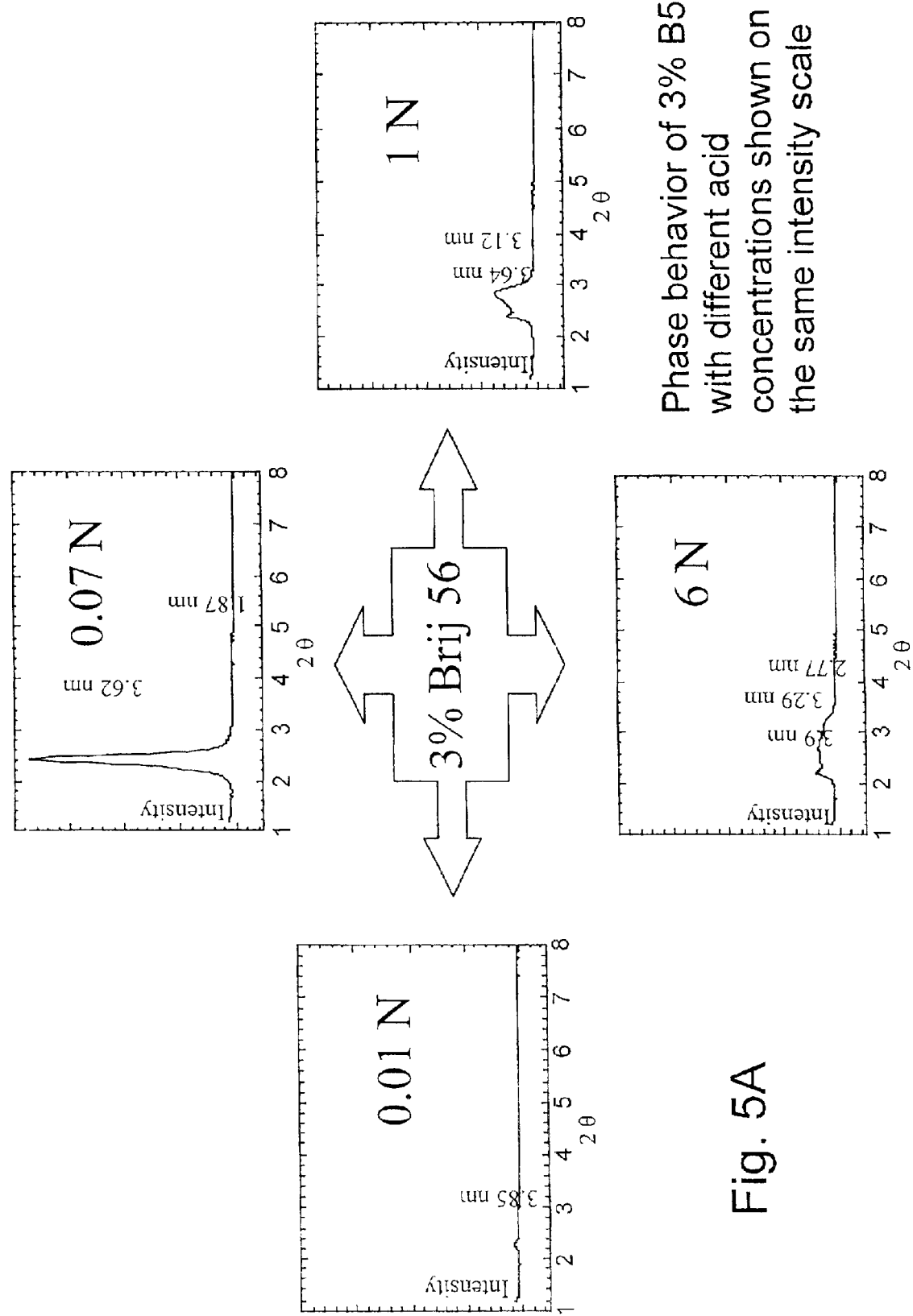
FIG. 5A illustrates the phase behavior of mesoporous silica systems of 3% Brij 56 with different HCl acid concentrations shown on the same intensity scale.

FIG. 5A illustrates XRD plots for films prepared using 3% Brij 56 with different HCl acid concentrations shown on the same intensity scale. As can be seen, the phase behavior of Brij 56 is significantly effected by amount of HCl in a coating solution of the present invention. FIG. 5B is a cross-section HR-TEM image of the 3% Brij 56 film made with 1N acid.

FIG. 6A is an optical image of an etched/calcined film of the present invention illustrating the effectiveness of the method of the present invention in creating patterns in silica. FIG. 6B is a listing of $^{29}$Si-NMR results of uncalcined powders made from drying Brij-56/PAG sols in a petri dish for the UV irradiated and unirradiated films. FIG. 6C is an HR-TEM image of an etched/calcined Brij-56 film of the present invention and illustrates the ability to build hierarchical structures.

Figure 7B:
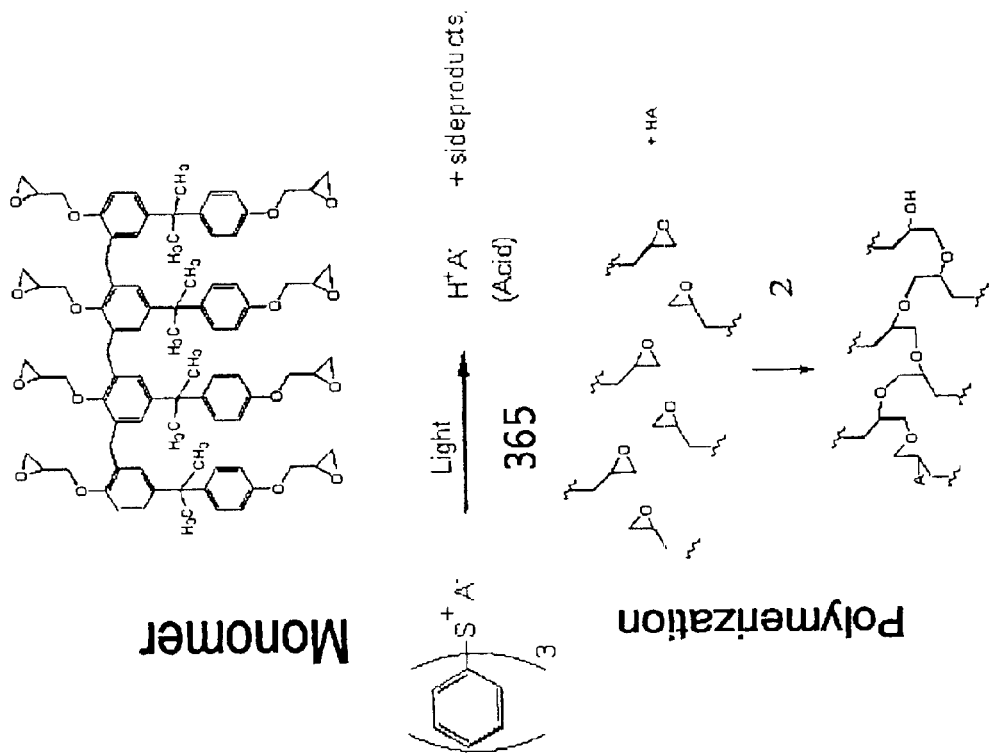
FIG. 7B illustrates the polymerization of an epoxide monomer.
Figure 7A:
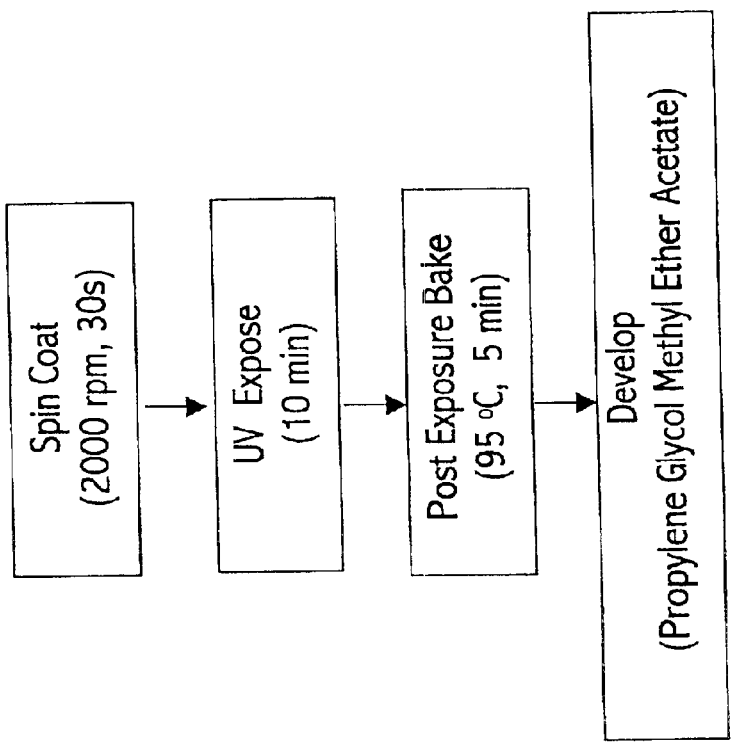
FIG. 7A is a flow chart illustrating a process for optically defining open and closed porosity in a self-assembled polymer/silica nanocomposite of the present invention.

FIG. 7A is a flow chart illustrating how a self-assembled polymer/silica nanocomposite of the present invention may be formed. By including an epoxide monomer, a polymer that polymerizes in the presence of light, as illustrated in FIG. 7B, after the mesoporous material has been patterned with UV light and baked, the polymer present in the mesoporous material may be polymerized using 365 nm light.

Although only the polymerization of one specific organic molecule is shown in FIG. 7A, other organic molecules that are optically polymerizable may be polymerized in a similar fashion. In addition, polymers that are UV polymerizable may also be polymerized during the patterning of the mesoporous material with UV light.

Figure 8B:
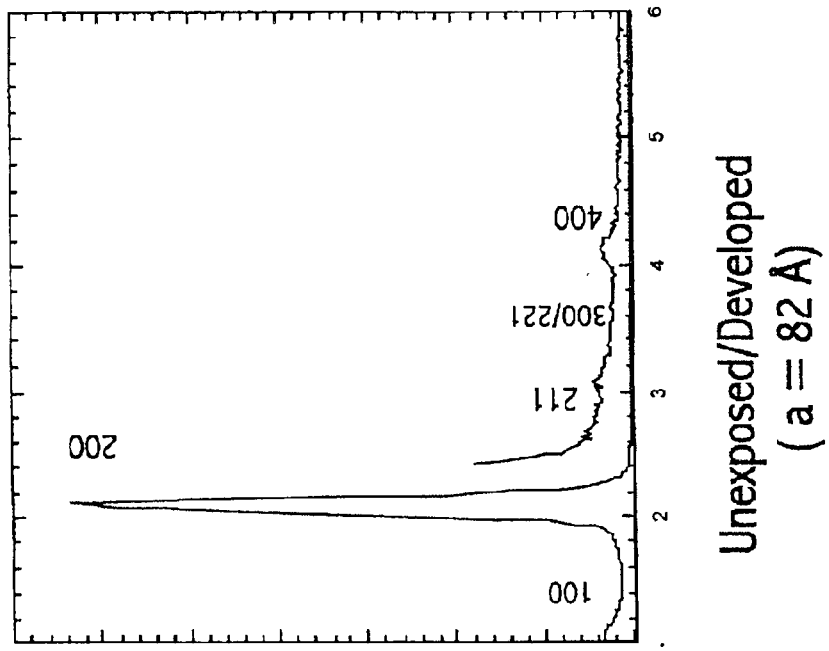
FIG. 8B illustrates the XRD pattern for a Brij 56/SU8 composite film coated on a substrate which is not exposed to UV light and subjected to solvent (PGMEA) development.
Figure 8A:
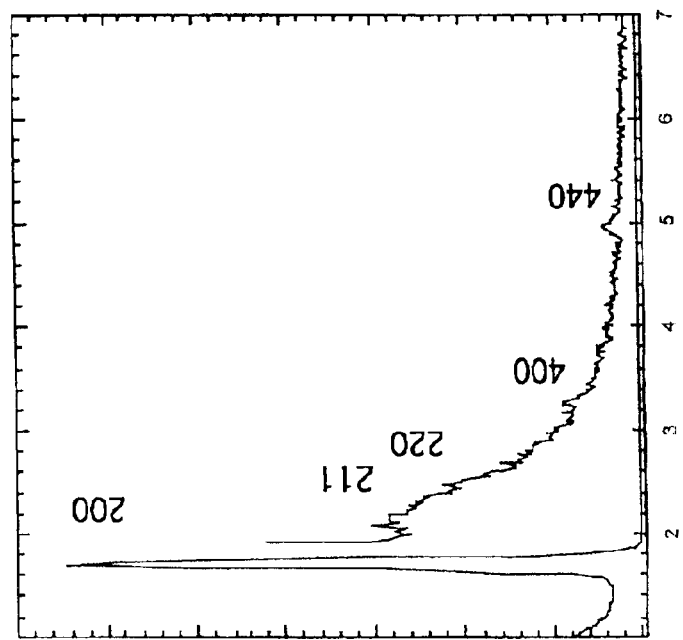
FIG. 8A illustrates the XRD pattern for a Brij 56/SU8 composition as coated on a substrate where SU8 is an epoxide based negative photoresist)

FIG. 8A illustrates the XRD pattern for a Brij 56/SU8 composition as coated on a substrate. FIG. 8B illustrates the XRD pattern for a Brij 56/SU8 composite filmcoated on a substrate which is not exposed to UV light and subjected to solvent (PGMEA) development.

Figure 9:
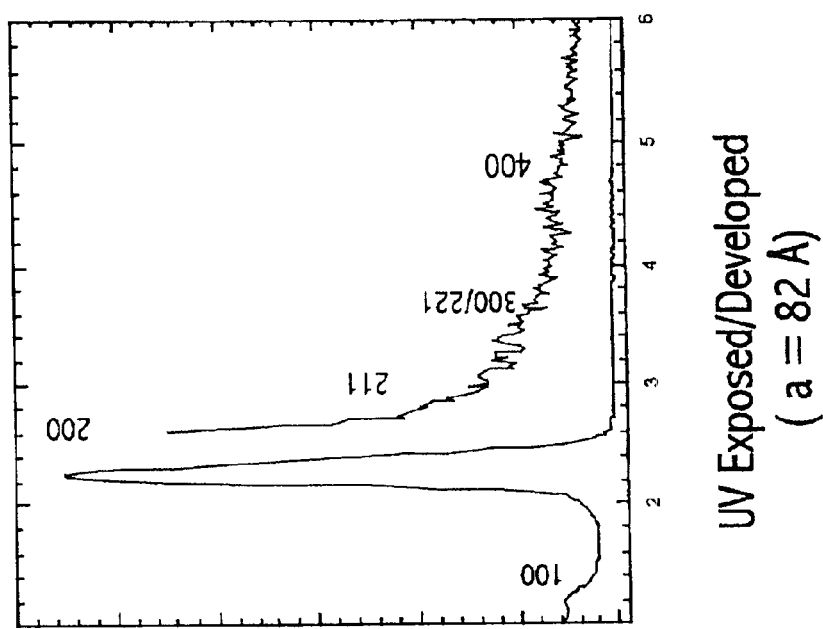
FIG. 9 illustrates the XRD pattern for a Brij 56/SU8composite mesoporous film of the present invention after being exposed and patterned by UV light and subjected to solvent development.

FIG. 9 illustrates the XRD pattern for a Brij 56/SU8composite mesoporous film of the present invention after being exposed and patterned by UV light and subjected to solvent development.

The present invention provides, for the first time, spatial control over the combination of different mesophases in a mesoporous material. This ability to tailor the phase (pore orientation) on a macro/micro scale and other spatially controlled function/property patterning on several length scales in these photo-responsive materials may have far-reaching influence on their applications in sensor arrays, optoelectronics, nano-reactors, photonic and fluidic devices, low dielectric constant films, waveguides, diffractive elements, photonic systems, micro-arrays, and catalysts for micro-reactors.

EXAMPLE 1

Precursor solutions were prepared by addition of the surfactant and the PAG (a diaryliodonium hexafluoroantimonate compound) to polymeric silica sols made by a two-step procedure (A2**), see C. J. Brinker, R. Sehgal, R. Raman, P. Schunk, T. Headley, J. Sol-Gel Sci. & Tech., 2, 469–476, 1994; designed to minimize the siloxane condensation rate, see C. J. Brinker, R. Sehgal, R. Raman, P. Schunk, T. Headley, J. Sol-Gel Sci. & Tech., 2, 469–476, 1994; and promoting facile silica-surfactant supra-molecular self-assembly during film deposition. First, TEOS (Si $(OC_2H_5)_4$), ethanol, water and HCl (mole ratios 1:4:1:5× $10^{-5}$) were heated at 60° C. for 90 min. This sol was diluted with ethanol (1 sol:2 $C_2H_5OH$) followed by addition of water and HCl. Finally, surfactant and the PAG were added such that the final reactant mole ratios were 1 TEOS:20 $C_2H_5OH$:3.1 $H_2O$:0.0065 HCl:0.0956 Brij 56:0.0156 PAG.

Figure 10:
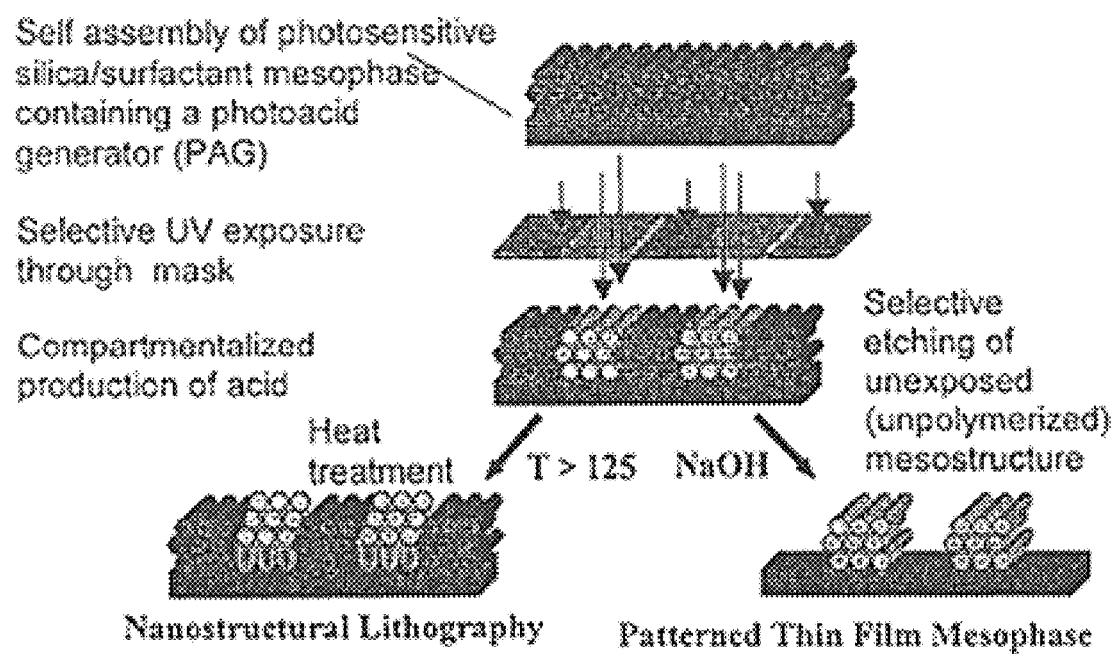
FIG. 10 illustrates the process of the present invention.

Films were deposited on (100)-silicon by dip-coating at 25.4 cm/min. Following film deposition, the samples were irradiated with short-wave ultraviolet (UV) light for 2 h through a mask via proximity printing to effectively transfer the pattern onto the silica thin film. Etching of the films was carried out with a 0.2 M NaOH solution. These films were then calcined at 450° C. for 3 h at a ramp rate of 1° C./min to burn out the organics, drive the structural transformation and give a true mesoporous film, see FIG. 10.

Preferential ethanol evaporation during dip-coating concentrated the depositing solution in water, silica, surfactant, HCl, and PAG, thereby promoting self-assembly into a photosensitive, silica/surfactant, thin film mesophase. Selective exposure of the photosensitive film to ultraviolet light, using a photo-mask, created patterned regions of differing acidity.

FIG. 11 is an optical image of localized acid generation via co-incorporation of a pH-sensitive dye (ethyl violet). The blue areas observed for unexposed film correspond to pH>2.5 and the yellow areas observed for UV exposed film to pH 0.

Figure 11A:
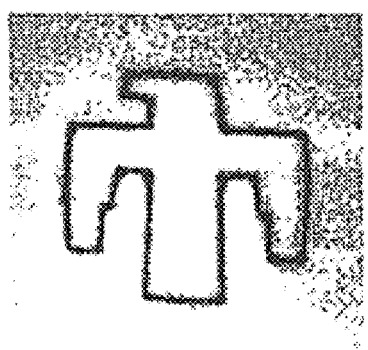
FIG. 11A Optical image of localized acid generation via co-incorporation of a pH-sensitive dye (ethyl violet). The blue areas observed for unexposed film correspond to pH>2.5 and the yellow areas observed for UV exposed film to pH 0.
Figure 11B:
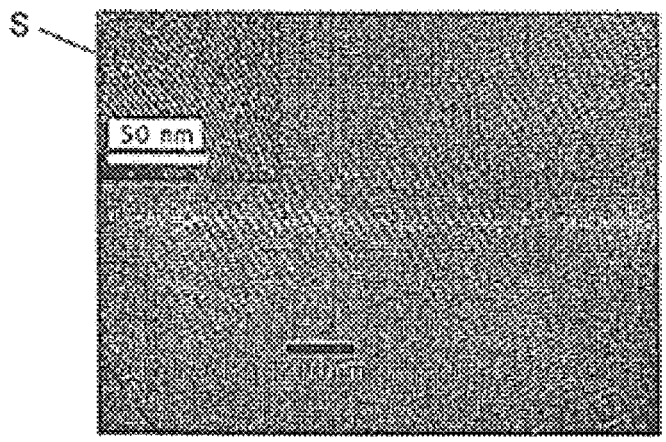
FIG. 11B shows an optical micrograph of an UV-exposed and etched thin film mesophase.
Figure 11C:
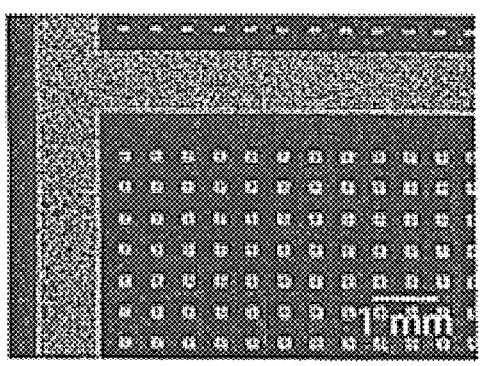
FIG. 11C is an optical interference image of the etched thin film mesophase of FIG. 11B.

The increasing acid-concentration promoted siloxane condensation, so selective UV exposure resulted in patterned regions of more highly and more weakly condensed silica. Differential siloxane condensation resulted in turn in differential solubility, allowing selective etching of weakly condensed regions in aqueous basic media (0.2 M NaOH). FIG. 11B shows an optical micrograph of an UV-exposed and etched thin film mesophase. A lithographically-defined (negative) pattern was observed in which film is present in the exposed regions and absent in the unexposed regions. The plan-view TEM micrograph, see inset S of FIG. 11B, reveals a striped mesoscopic structure consistent with a 1-dimensional hexagonal (1-dH) mesophase Another consequence of the differential siloxane condensation was the optical interference image, see FIG. 11C, observed as a result of the thickness and refractive index contrast. A refractive index difference of 0.025 at 630 nm makes it attractive for wave-guide applications.

Figure 11D:
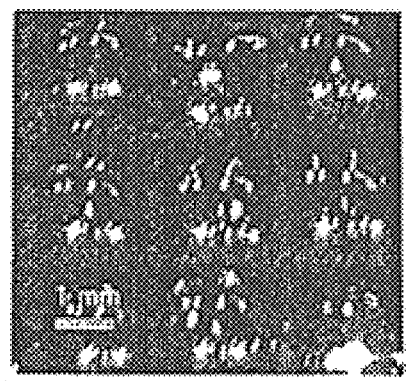
FIG. 11D shows an array of water droplets contained within patterned hydrophobic/hydrophilic corrals.
Figure 12:
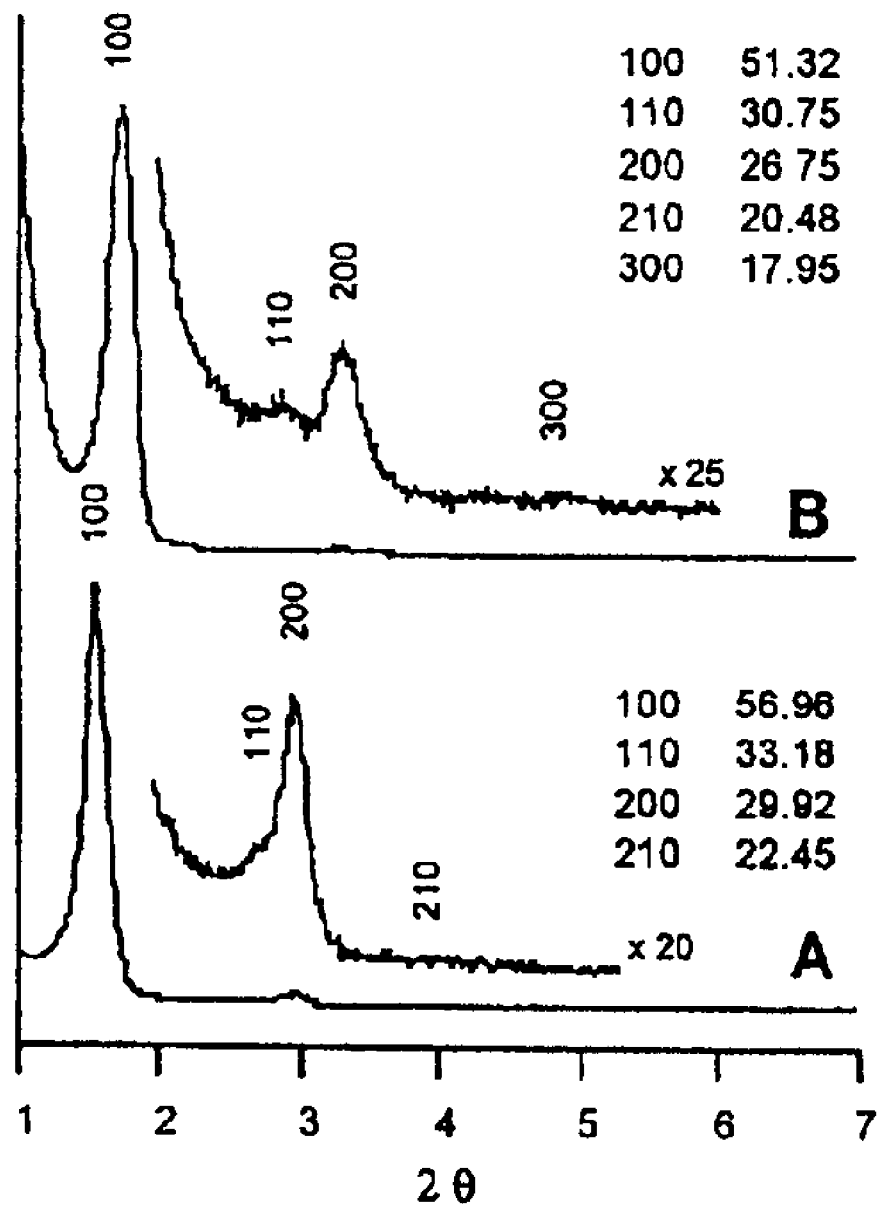
FIG. 12 is a P-XRD pattern of a uncalcined mesoporous film (A=unexposed, B=UV exposed)

Another functional pattern obtained is the definition of hydrophobic and hydrophilic regions based on the UV exposure. Photolysis of the PAG generated organics which made the UV exposed regions hydrophobic (contact angle= 40°) whereas the unexposed regions remained hydrophilic (contact angle<10°). FIG. 11D which shows an array of water droplets contained within patterned hydrophobic/hydrophilic corrals, is a manifestation of this property.

EXAMPLE 2

Figure 13A:
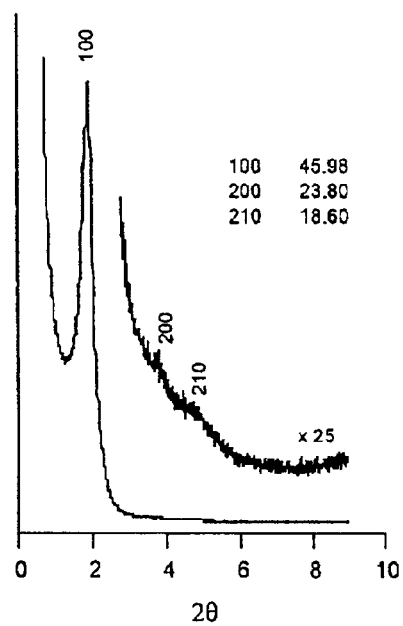
FIG. 13A is a PXRD pattern for calcined and unexposed film.
Figure 13B:
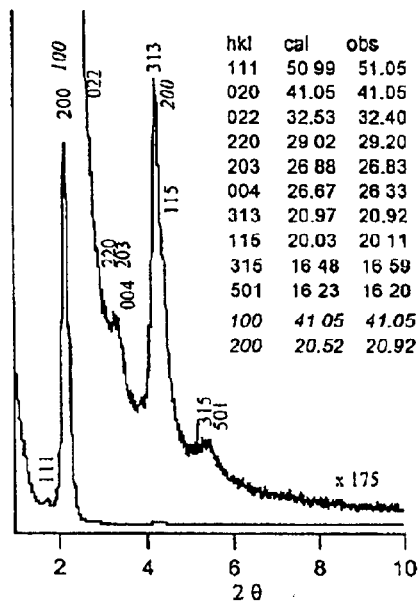
FIG. 13B is a PXRD pattern for calcined and UV exposed film showing a cubic phase.
Figure 14A:
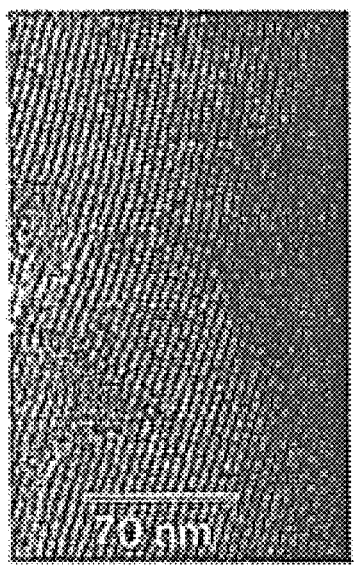
FIG. 14A is a TEM image for an unirradiated and calcined mesoporous film.
Figure 14B:
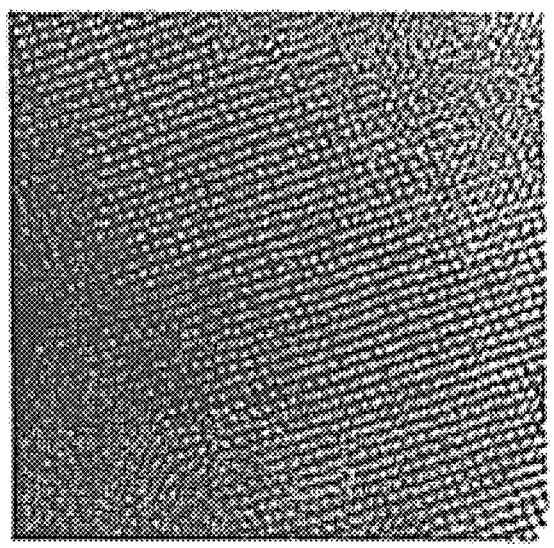
FIG. 14B is a TEM image for an irradiated and calcined mesoporous film.

The second mode of optical-mediation is the patterning of mesophases/mesostructure in thin films. Initial experiments were carried out to determine the pH sensitivity of the silica/surfactant mesophases. Based on these experiments the experimental parameters were chosen to perform nano-structural lithography. The P-XRD pattern, see FIG. 13, for the film fragments detached from the petri dish (to prevent one dimensional shrinkage) and calcined are distinctly different. The unirradiated film (trace A) retains the hexagonal structure (lower curvature) with unit cell constant a=52.8 Å. In case of the irradiated film (trace B) presence of a tetragonal phase (higher curvature) with unit cell constant a=b=82.1 Å, c=106.6 Å along with a hexagonal mesophase (a=47.4 Å) is observed. FIG. 13A is PXRD pattern for calcined and unexposed film. FIG. 13B is PXRD pattern for calcined and UV exposed film showing a cubic phase The TEM image for the unirradiated and calcined film, see FIG. 14A shows a stripped pattern consistent with the [110]-zone axis of a 1-dH mesophase. FIG. 14B shows the [100]-zone axis for the tetragonal mesophase present in the irradiated and calcined film.

Figure 15A:
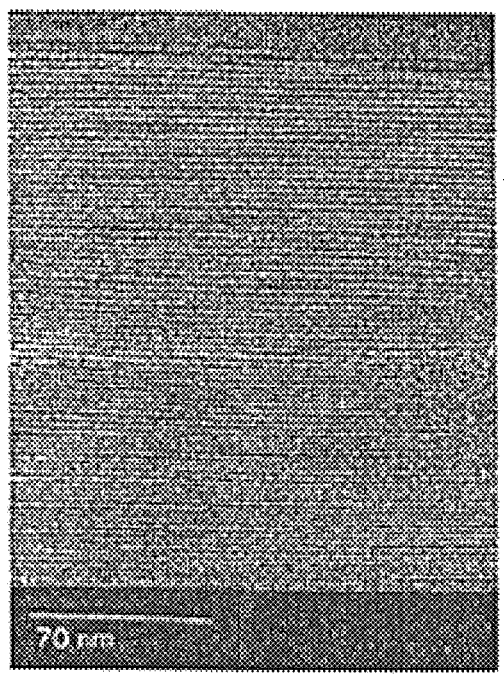
FIG. 15A is a cross-sectional TEM image for an unirradiated/calcined mesoporous film.
Figure 15B:
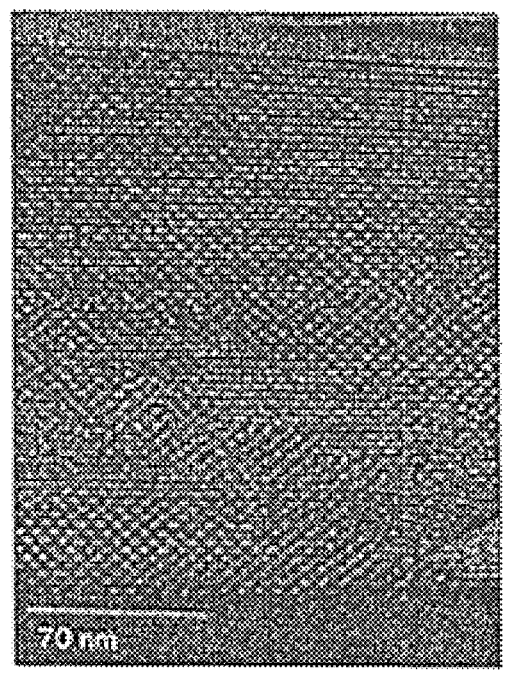
FIG. 15B is a cross-sectional TEM image for an irradiated/calcined mesoporous film.

The trend for films dip-coated on Si (100) substrates was similar, Figure shows the XRD pattern for calcined silica/surfactant thin film mesophases. The pattern for the unirradiated film (trace A) is consistent with a 1 dH mesophase with unit cell constant a=42.1 Å, whereas, the pattern for the irradiated film (trace B) is indicative of the presence of a tetragonal phase (note the 111 reflection) with a=66.8 Å, b=c=72.8 Å. To establish that the phase transformation is a result of the pH change, unirradiated films were exposed to HCl vapors and then calcined. The pattern (trace C) for such a film is akin to the one obtained for the irradiated film (trace B). Cross-sectional TEM image for the unirradiated/calcined film, see FIG. 15A, shows a layered structure consistent with the [110] direction of a 1-dH mesophase with the tubules oriented parallel to the substrate. The cross-sectional TEM for the irradiated/calcined, see FIG. 15B, captures the transition from 1dH to a tetragonal or distorted cubic mesophase.

EXAMPLE 3

Precursor solutions were prepared by addition of the surfactant and the PAG (a diaryliodonium hexafluoroantimonate compound) to polymeric silica sols made by a two-step procedure (A2**), C. J. Brinker, R. Sehgal, R. Raman, P. Schunk, T. Headley, J. Sol-Gel Sci. & Tech., 2, 469–476, 1994, designed to minimize the siloxane condensation rate, see C. J. Brinker, R. Sehgal, R. Raman, P. Schunk, T. Headley, J. Sol-Gel Sci. & Tech., 2, 469–476, 1994, and promoting facile silica-surfactant supra-molecular self-assembly during film deposition. First, TEOS (Si $(OC_2H_5)_4$), ethanol, water and HCl (mole ratios 1:4:1:5× $10^{-5}$) were heated at 60° C. for 90 min. This sol was diluted with ethanol (1 sol:2 $C_2H_5OH$) followed by addition of water and HCl. Finally, surfactant and the PAG were added such that the final reactant mole ratios were 1 TEOS:20 $C_2H_5OH$:3.1 $H_2O$:0.0065 HCl:0.127 CTAB:0.00625 PAG and 1 TEOS:20 $C_2H_5OH$:3.1 $H_2O$:0.0065 HCl:0.0956 Brij 56:0.0156 PAG.

Films were deposited on (100)-silicon by dip-coating at 25.4 cm/min. The coating environment was varied from dry conditions (CTAB system) to a relative humidity of 30–40% (Brij56 system). Following film deposition, the samples were irradiated with short-wave ultraviolet (UV) light for 2 h through a mask via proximity printing to effectively transfer the pattern onto the silica thin film. Etching of the films was carried out with a 0.2 M NaOH solution. These films were then calcined at 450° C. for 3 h at a ramp rate of 1° C./min to burn out the organics, drive the structural transformation and give a true mesoporous film, see also FIG. 10.

Figure 16A:
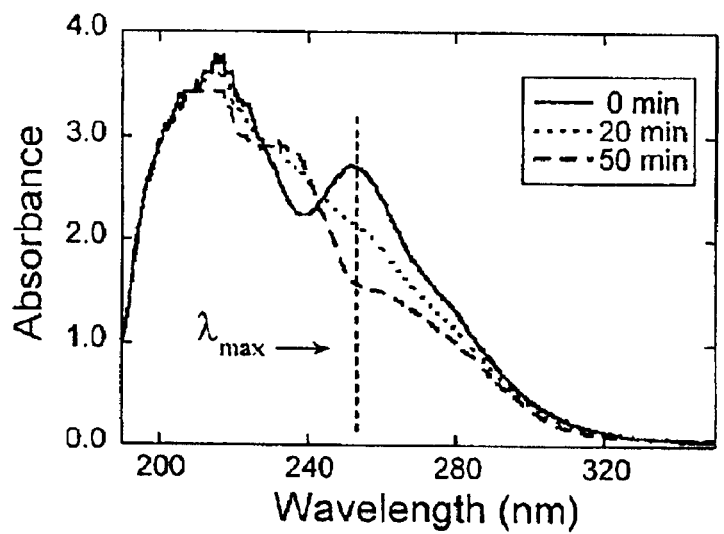
FIG. 16A is a graph illustrating decomposition of the PAG with time as followed by the UV absorbance change of a typical coating sol.
Figure 16B:
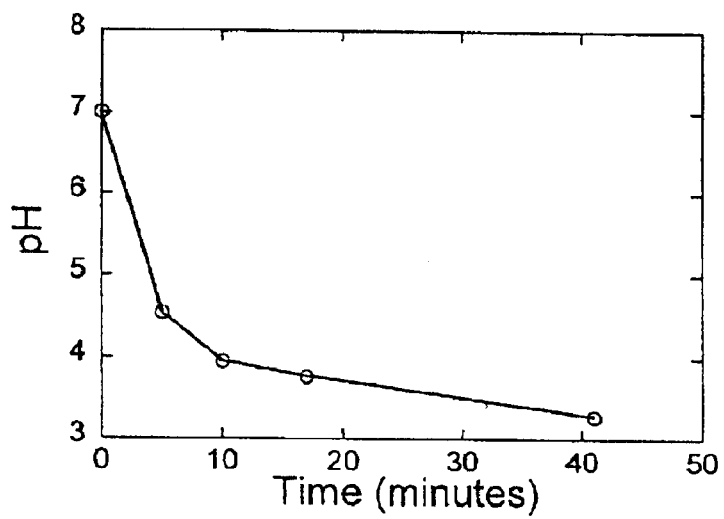
FIG. 16B is a graph illustrating a change in pH of a PAG/Water solution with irradiation time.

The UV absorbance change of the coating sol with time of UV irradiation, see FIG. 16A, shows a decrease in the $\lambda_{max}$ (254 nm) intensity due to the decomposition of the PAG, that releases a strong Bronsted acid resulting in a decrease of the pH. This behavior of the pH can be seen in FIG. 16B for a PAG/water solution. The ability to change the pH with UV irradiation in thin films was confirmed by incorporating a pH-sensitive dye (ethyl violet) in the coating sol and observing the color change from violet (pH 2.5) to yellow (pH 0) for films coated on glass slides.

Figure 17A:
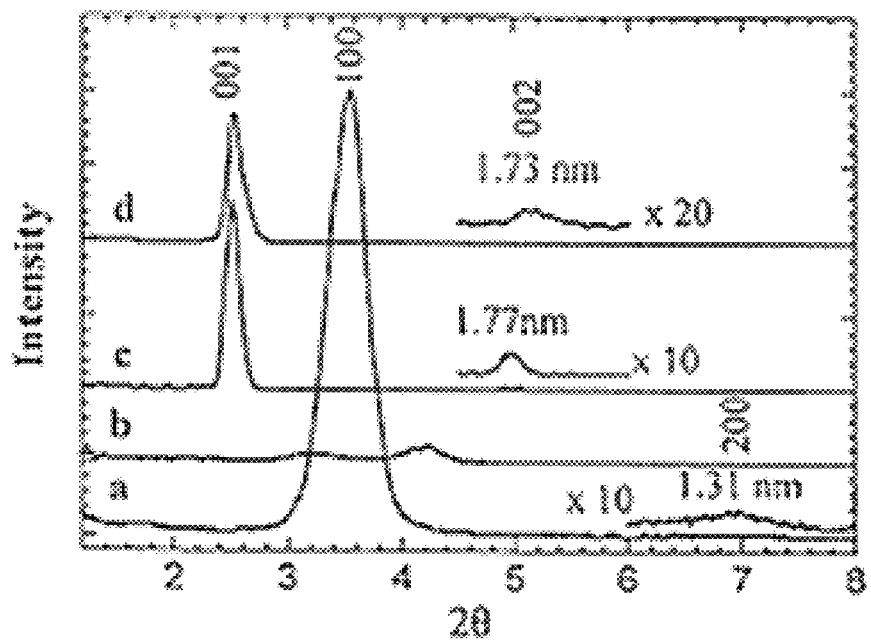
FIG. 17A is an X-ray diffraction pattern recorded on a Siemens D500 diffractometer in θ-2θ scan mode for CTAB films; with trace (c) for unirradiated, (d) for irradiated, (a) for irradiated and calcined, (b) for unirradiated and calcined.
Figure 17B:
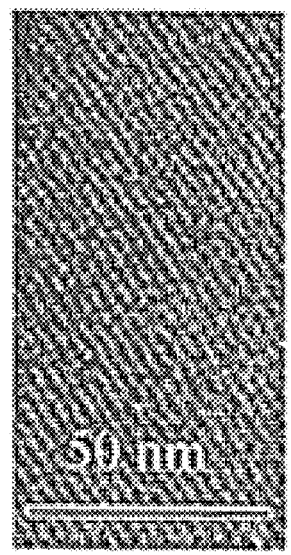
FIG. 17B is an HR-TEM image of irradiated and calcined film along the [110] 7zone axis.
Figure 17C:
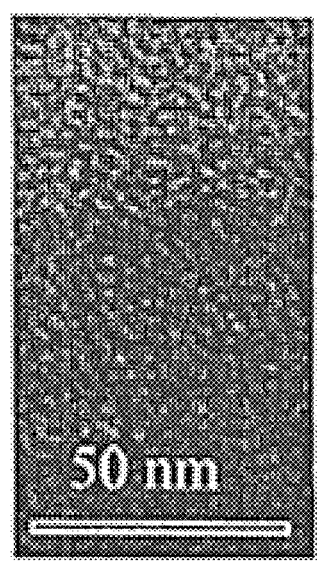
FIG. 17C is an HR-TEM image of unirradiated and calcined film along the [110] zone axis.

The influence of the photolysis on the mesostructure of the silica films can be seen in FIG. 17A, which shows X-ray diffraction (XRD) patterns for CTAB films with and without UV irradiation. The as-prepared films (trace c,d) are lamellar in nature, with the PAG causing a 1 Å swelling over the typical CTAB bi-layer spacing of 34.5 Å, see X. Auvray, C. Petipas, R. Anthore, I. Rico and A. Lattes, J. Phys. Chem., 93, 7458–7464, (1989). On irradiation there is a decrease in the basal spacing (trace d) as a result of photoacid-catalyzed network condensation. The presence of the PAG in the unirradiated film results in destruction (destabilization) of the sensitive cubic phase expected to be formed upon calcination, Y. Lu, R. Ganguli, C. A. Drewien, M. T. Anderson, C. J. Brinker, W. Gong, Y. Guo, H. Soyez, B. Dunn, M. H. Huang, J. I. Zink, Nature, 389, 364–368, 1997, depicted by the broad and weak reflections in the XRD pattern (trace b). For the UV irradiated film (trace a), decrease in pH overwhelms the effect of the PAG, resulting in a 1 dH mesophase with a unit cell constant a=30.2 Å. This observation is consistent with the results obtained by increasing the acid concentration in the coating sol, Y. Lu, R. Ganguli, C. A. Drewien, M. T. Anderson, C. J. Brinker, W. Gong, Y. Guo, H. Soyez, B. Dunn, M. H. Huang, J. I. Zink, Nature, 389, 364–368, 1997. The XRD data is supported by the high resolution-TEM images showing a layered structure as expected for 1 dH mesophase, see FIG. 17B, in the irradiated and calcined film, but a disordered structure is seen for the unirradiated and calcined film, see FIG. 17C.

Figure 18:
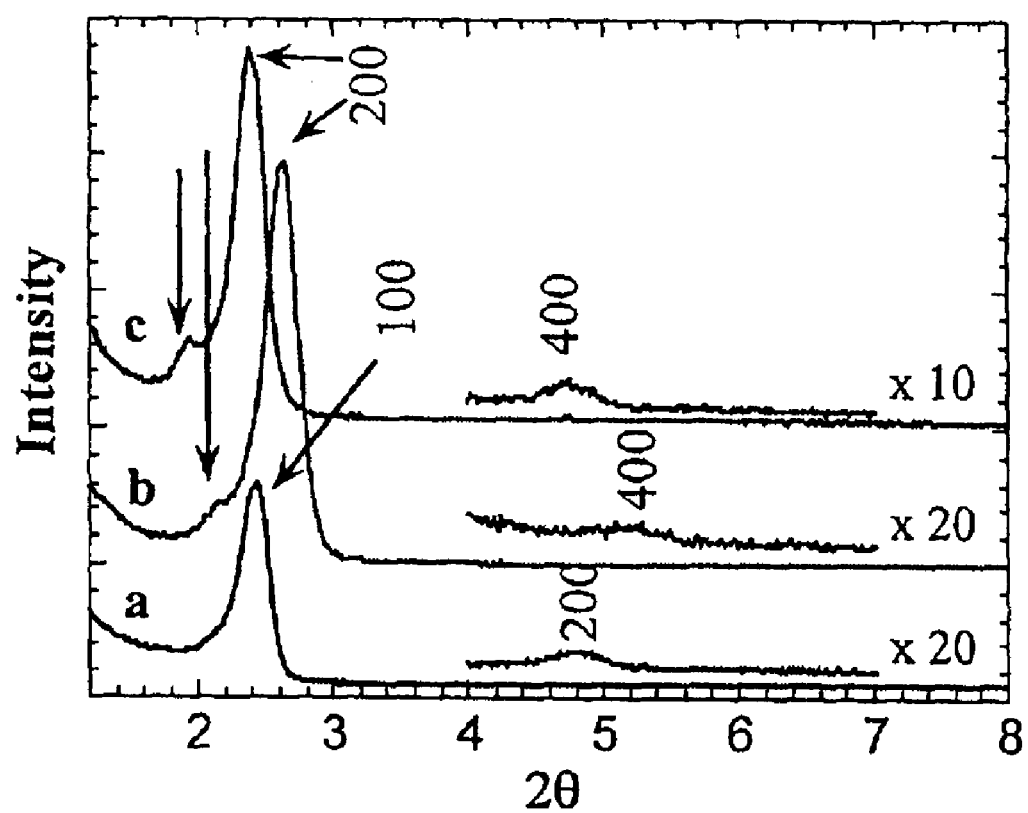
FIG. 18 is an XRD pattern for Brij 56 films; with trace (a) for unirradiated calcined; (b) for irradiated calcined, (c) for the unirradiated film exposed to HCl vapors, then calcined.

Initial experiments have shown a strong pH dependence of the mesophase for the Brij 56 system as well, in which the cooperative self-assembly process is based on hydrogen bonding interactions. XRD patterns, see trace a of FIG. 18, for Brij 56 suggest a 1 dH structure with unit cell constant a=42.1 Å, for the unirradiated calcined film. Trace b shows the corresponding irradiated calcined sample with a pattern that is indicative of a cubic structure. To confirm that this transformation is caused by the pH change in the film, the unirradiated film was exposed to HCl vapor and then calcined (trace c). The data for this film show a pattern consistent with the UV irradiated film, indicative of a cubic structure distorted to tetragonal by one-dimensional shrinkage. The unit cell constants would be a=66.8 Å, b=c=72.8 Å and a=74.2 Å, c =82 Å for the irradiated and HCl-exposed films, respectively.

The influence of the photolysis can be seen optically in FIG. 3B due to the differences in thickness and refractive index amongst the various regions of the pattern. Initially, the thickness of the irradiated region is lower than that of the unirradiated region as a result of acid promoted siloxane condensation and the associated network shrinkage. This pre-calcination condensation makes the network resistant to further shrinkage during calcination as seen by the greater thickness of the irradiated film as compared to the unirradiated one, see Table 1 below. The refractive index difference of 0.025 at 630 nm makes it attractive for wave-guide applications. The back-scattered emission image and the EDX analysis performed using an SEM showed no chemical difference between the irradiated and unirradiated parts of the film.

TABLE 1

Ellipsometry data (λ = 630 nm) showing thickness and refractive index for B56 films

| | As-prepared Films | | Calcined Films | |
|---|---|---|---|---|
| | Thickness Å | Refractive Index | Thickness Å | Refractive Index |
| Unirradiated | 3651 ± 26 | 1.454 | 2293 ± 22 | 1.302 |
| UV Irradiated | 3602 ± 21 | 1.457 | 2399 ± 23 | 1.277 |

The $^{29}$Si-NMR of films dried in a petri dish shows 80.8% extent of reaction (Q2/Q3/Q4=9.61/57.75/32.64) for the unirradiated as compared to 82.1% (Q2/Q3/Q4=8.22/55.08/36.7) for the irradiated. It can be expected that this difference would be much greater just after irradiation in the "wet" as-prepared films. This difference is utilized to selectively etch the unirradiated film with a 0.2 M NaOH solution. Presently, the etching resolution obtained is 10 $\mu$m, see FIG. 11B, although this technique holds promise to achieve far better resolution due to the encapsulation of the PAG in well-defined pore channels. The swirling tubules seen in the HR-TEM image, see 6D, along with the XRD pattern are suggestive of the presence of a 1 dH mesophase with unit cell constant a=53.1 Å, in the etched film after calcination.

We have demonstrated a simple lithographic procedure, which allows a deliberate tailoring of mesophases in thin silica films. For the first time a spatial control over the combination of different mesophases in a mesoporous material has been achieved. This ability to tailor the phase (pore orientation) on a macro scale could have far-reaching influence on the applications of these materials in separations, catalysis, sensors and optoelectronics. Detailed investigations showed that photolysis of the photoacid generator results in a release of a strong acid, which causes an increase in the degree of condensation of the silica network, along with a transformation of the lyotropic phase. The use of different surfactant systems proved the versatility of this process.

In addition to the ability to tailor the mesophase, the process shows great potential to pattern the film and build hierarchical structures by exploiting the negative resist characteristics of the photoactive silica thin film. Future work and therefore an extension of this process involves the use of different photosensitive molecules and other material combinations to access not only different pH domains but also other mesophases.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A method for forming a patterned mesoporous material comprising:
    coating a sol on a substrate to form a film, said sol comprising: a templating molecule, a photoactivator generator, a material capable of being sol-gel processed, and a solvent; and
    exposing said film to light to form a patterned mesoporous material.

2. The method of claim 1, wherein said light is UV radiation.

3. The method of claim 1, wherein said solvent comprises ethyl alcohol.

4. The method of claim 1, wherein said photoactivator generator comprises a photoacid generator.

5. The method of claim 1, wherein said photoactivator generator comprises a photobase generator.

6. The method of claim 1, wherein said sol further comprises an acid for adjusting the pH of said sol.

7. The method of claim 1, wherein said material capable of being sol-gel processed comprises silica.

8. The method of claim 1, wherein said sol further comprises an optically polymerizable monomer.

9. The method of claim 8, wherein said optically polymerizable monomer comprises an epoxide monomer and said method further comprises exposing said patterned mesoporous material to light to polymerize said optically polymerizable monomer.

10. The method of claim 1, wherein at least two regions of said patterned mesoporous material have different physical properties.

11. The method of claim 10, wherein said at least two regions have different refractive indexes in comparison to each other.

12. The method of claim 10, wherein said at least two regions have different mesostructures in comparison to each other.

13. The method of claim 10, wherein said at least two regions have different pore volumes in comparison to each other.

14. The method of claim 10, wherein said at least two regions have different pore sizes in comparison to each other.

15. The method of claim 10, wherein said at least two regions have different thicknesses in comparison to each other.

16. The method of claim 10, wherein said at least two regions have different wetting behaviors in comparison to each other.

17. The method of claim 10, wherein said at least two regions have different etching behaviors in comparison to each other.

18. The method of claim 10, wherein a physical property of said different physical properties has a discrete difference for the physical property between said at least two regions.

19. The method of claim 10, wherein a physical property of said different physical properties varies as a gradient across said at least two regions.

20. The method of claim 1, wherein the method further comprises selective etching of said film.

21. The method of claim 20, wherein selective etching of said film includes irradiating said film with ultraviolet light through a mask via proximity printing.

22. The method of claim 20, further comprising the step of calcinating said mesoporous material after said at least one region has been etched.

23. The method of claim 1, further comprising the step of calcinating said mesoporous material.

24. A method for forming a patterned mesoporous material comprising:
    coating a sol on a substrate to form a film, said sol comprising: a templating molecule, a photoactivator generator, a material capable of being sol-gel processed, water, and a solvent; and
    exposing said film to light to form a patterned mesoporous material, wherein said templating molecule comprises CTAB.

25. A method for forming a patterned mesoporous material comprising:
    coating a sol on a substrate to form a film, said sol comprising: a templating molecule, a photoactivator generator, a material capable of being sol-gel processed, water. and a solvent; and
    exposing said film to light to form a patterned mesoporous material, wherein said templating molecule comprises Brij 56.

26. A method for forming a patterned mesoporous material comprising:
    coating a sol on a substrate to form a film, said sol comprising: a templating molecule, a photoactivator generator, a material capable of being sol-gel processed, water, and a solvent; and
    exposing said film to light to form a patterned mesoporous material, wherein said photoactivator generator comprises a diaryliodonium compound.

* * * * *

UNITED STATES PATENT AND TRADEMARK OFFICE
CERTIFICATE OF CORRECTION

PATENT NO.    : 6,808,867 B2  
DATED         : October 26, 2004  
INVENTOR(S)   : Doshi et al.

Page 1 of 1

It is certified that error appears in the above-identified patent and that said Letters Patent is hereby corrected as shown below:

<u>Column 14,</u>  
Line 50, after "water" delete "." and insert -- , --,therefor.  
Line 53, delete "Brij 56" and insert -- $CH_3(CH_2)_{15}(OCH_2CH_2)_{10}OH$ --, therefor.

Signed and Sealed this

Tenth Day of May, 2005

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 6,808,867 B2 | Page 1 of 1 |
| APPLICATION NO. | : 10/100108 | |
| DATED | : October 26, 2004 | |
| INVENTOR(S) | : Doshi et al. | |

It is certified that error appears in the above-identified patent and that said Letters Patent is hereby corrected as shown below:

In column 1, lines 18–21, delete "This invention is made with government support under Grant Number BF-4277 awarded by Sandia National Laboratories. The government may have certain rights in this invention." and insert -- This invention was developed under Contract no. DE-AC04-94AL85000 between Sandia Corporation and the U.S. Department of Energy. The U.S. Government has certain rights in this invention. --, therefor.

Signed and Sealed this
Twelfth Day of April, 2011

David J. Kappos
*Director of the United States Patent and Trademark Office*